(12) United States Patent
Tokumitsu

(10) Patent No.: US 7,136,301 B2
(45) Date of Patent: Nov. 14, 2006

(54) SEMICONDUCTOR MEMORY DEVICE AND DRIVING METHOD THEREOF

(75) Inventor: Shigeo Tokumitsu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 124 days.

(21) Appl. No.: 10/956,124

(22) Filed: Oct. 4, 2004

(65) Prior Publication Data
US 2005/0073002 A1    Apr. 7, 2005

(30) Foreign Application Priority Data
Oct. 6, 2003    (JP)    ............... 2003-346842

(51) Int. Cl.
*G11C 5/06* (2006.01)
*G11C 11/40* (2006.01)
*H01L 29/792* (2006.01)

(52) U.S. Cl. .................. 365/184; 365/51; 365/72; 257/314; 257/324

(58) Field of Classification Search ................. 365/184
See application file for complete search history.

(56) References Cited

U.S. PATENT DOCUMENTS

| | | | |
|---|---|---|---|
| 6,735,124 B1 * | 5/2004 | Melik-Martirosian et al. | 365/185.28 |
| 6,809,371 B1 * | 10/2004 | Sugiyama | 257/314 |
| 6,936,891 B1 * | 8/2005 | Saito et al. | 257/331 |
| 7,016,225 B1 * | 3/2006 | Roizin et al. | 365/185.03 |
| 2005/0199912 A1 * | 9/2005 | Hofmann et al. | 257/204 |

FOREIGN PATENT DOCUMENTS

JP    2001-110918    4/2001

OTHER PUBLICATIONS

B. Eitan, et al., "Can NROM, a 2-bit, Trapping Storage NVM Cell, Give a Real Challenge to Floating Gate Cells?" SSDM (1999).

* cited by examiner

*Primary Examiner*—Evan Pert
(74) *Attorney, Agent, or Firm*—McDermott Will & Emery LLP

(57) ABSTRACT

First active regions and second active regions intersecting the first active regions at a right angle are defined on the surface of a semiconductor substrate, and diffusion regions are formed in the first and second active regions to interpose an intersecting region therebetween. Then, a gate structure is formed linearly to extend over the intersecting region at a non-zero angle with respect to the first and second active regions. Further, terminals to be connected to metal interconnects are provided on the diffusion regions at a non-zero angle with respect to the first and second active regions, respectively. Consequently provided is a nonvolatile semiconductor memory having a simple gate structure capable of storing 4-bits of information in one memory cell.

6 Claims, 5 Drawing Sheets

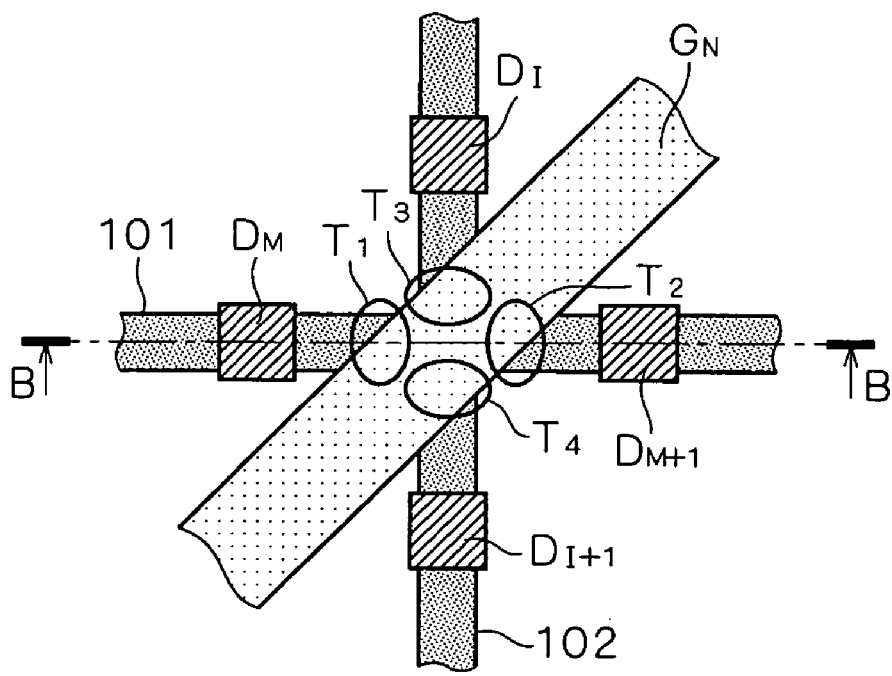
F I G . 4
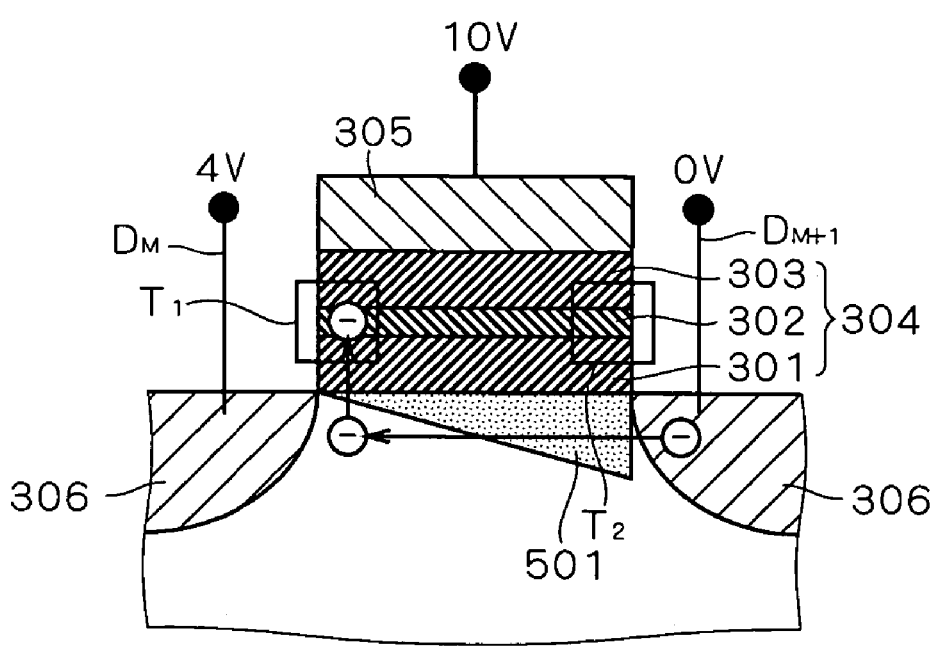
F I G . 5

SEMICONDUCTOR MEMORY DEVICE AND DRIVING METHOD THEREOF

BACKGROUND OF THE INVENTION

1. Field of the Invention

The present invention relates to a semiconductor memory device and a driving method thereof, and particularly to a technique of storing multi-bit information on a nonvolatile memory.

2. Description of the Background Art

Higher packing density of semiconductor memories has been achieved by scaling down the cell size in accordance with the so-called scaling rule. Recently, however, the scale-down of cell size is becoming increasingly difficult due to technical reasons in lithography and the like, or due to the limits of how thin a gate insulating film, a source diffusion layer and a drain diffusion layer constituting a memory cell can be made. Therefore, for one of the methods of solving this problem, attempts are being made to develop the technology of storing multi-bit information on one memory cell.

What is expected as a multi-bit nonvolatile memory is a so-called MONOS (metal-oxide-nitride-oxide-silicon)-type nonvolatile semiconductor memory device, for example (cf. B. Eitan, et al., "Can NROM, a 2-bit, Trapping Storage NVM Cell, Give a Real Challenge to Floating Gate Cells?" SSDM (1999)). In this MONOS-type nonvolatile semiconductor memory device, a gate insulating film has a so-called ONO (oxide-nitride-oxide) structure, and hot electrons are injected in two separate positions through a silicon oxide film, to thereby allow 2-bits of information to be stored on one memory cell.

Japanese Patent Application Laid-Open No. 2001-110918 discloses that a gate insulating film in a MONOS-type nonvolatile semiconductor memory device has silicon nitride films in two layers. Hot electrons are injected in two separate positions, and a distinction is made between the state in which hot electrons are injected only into a first-layer silicon nitride film and the state in which hot electrons are injected into both the first-layer and second-layer silicon nitride films, to thereby allow 4-bits of information to be stored on the memory cell.

In the conventional MONOS-type nonvolatile semiconductor memory device, however, only 2-bits of information can be stored on one memory cell. The invention described in Japanese Patent Laid-Open No. 2001-110918 allows 4-bits of information to be stored on one memory cell, but causes the gate insulating film to have a complicated structure, which disadvantageously increases the number of manufacturing steps and accordingly increases manufacturing costs.

SUMMARY OF THE INVENTION

An object of the present invention is to store 4-bits of information on one memory cell without increasing the number of manufacturing steps.

According to an aspect of the present invention, a semiconductor memory device includes a first active region, a second active region, first and second diffusion regions, third and fourth diffusion regions, a gate structure and first to fourth terminals. The first active region is defined linearly on a surface of a substrate. The second active region is defined linearly on the surface of the substrate to intersect the first active region in an intersecting region. The first and second diffusion regions are formed in the first active region to interpose the intersecting region therebetween. The third and fourth diffusion regions are formed in the second active region to interpose the intersecting region therebetween. The gate structure is formed linearly on the substrate to extend over the intersecting region. The first to fourth terminals are connected to the first to fourth diffusion regions, respectively.

Hot electrons generated in the vicinity of the diffusion regions are locally stored in a gate insulating film in the gate structure. This allows 4-bits of information to be stored on one memory cell. Further, it is not required to provide a gate structure having a gate insulating film of complicated structure. Therefore, the semiconductor memory device is manufactured without any increase in the number of manufacturing steps.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a top view showing the relationship between electron storing positions in the memory cell shown in FIG. 2;

FIG. 5 is a sectional view showing a programming operation on the memory cell shown in FIG. 2;

DESCRIPTION OF THE PREFERRED EMBODIMENTS

Figure 1:
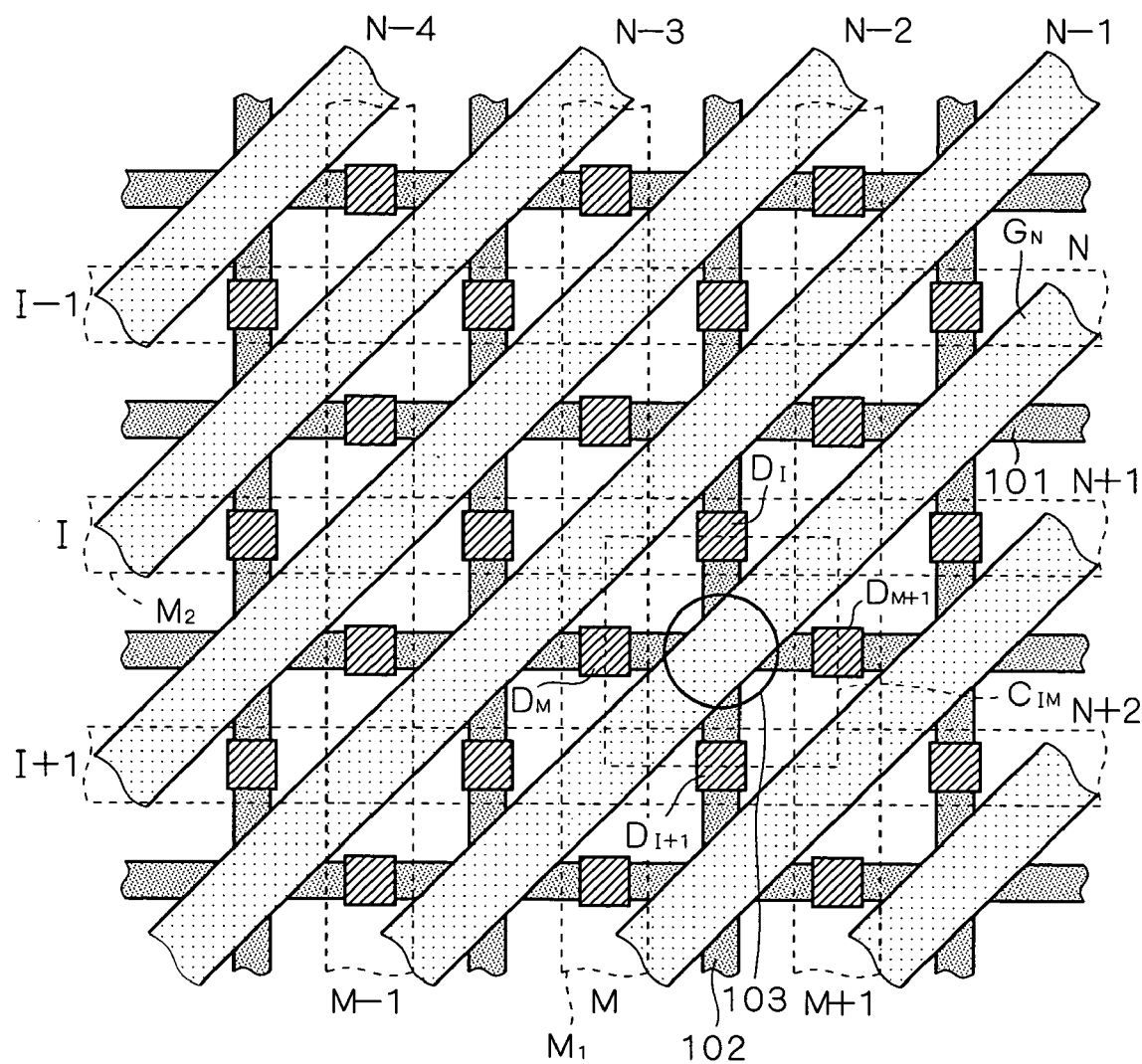
FIG. 1 is a top view of a memory cell array of a semiconductor memory device according to a preferred embodiment of the present invention.
Figure 2:
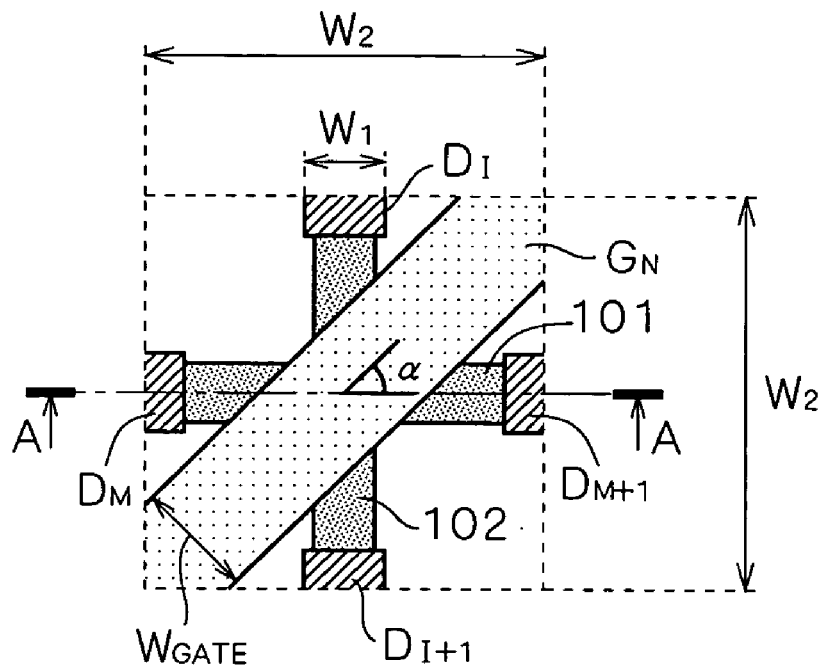
FIG. 2 is a top view showing exemplary dimensions of a memory cell.
Figure 3:
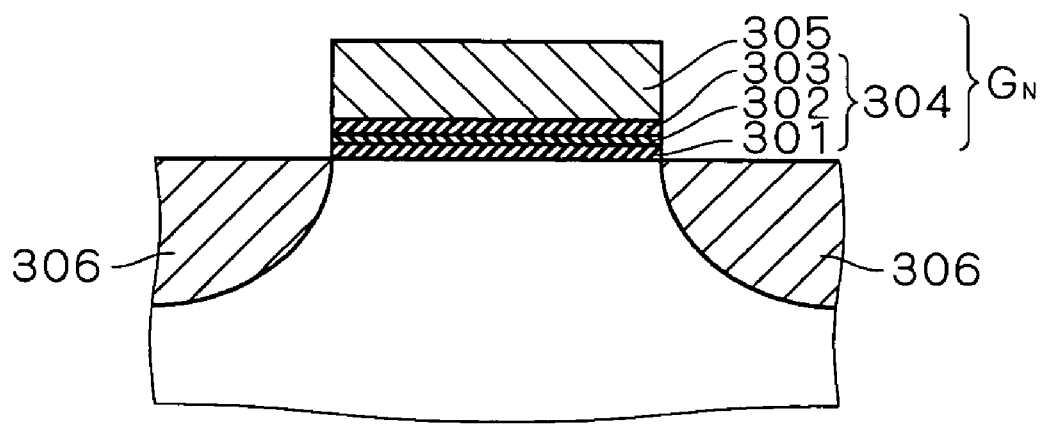
FIG. 3 is a schematic sectional view of the memory cell shown in FIG. 2.

FIG. 1 is a top view of a memory cell array of a semiconductor memory device according to a preferred embodiment of the present invention. FIG. 2 is a top view of a memory cell, and FIG. 3 is a schematic sectional view of the memory cell taken along the line A—A shown in FIG. 2.

As shown in FIG. 1, the semiconductor memory device according to the present embodiment is configured such that a plurality of active regions 101 separated by a field oxide film on a surface of a substrate, e.g., a P-type silicon substrate are defined linearly in the horizontal direction in the drawing. A plurality of active regions 102 are defined linearly in the vertical direction in the drawing. In other words, the plurality of active regions 101 and the plurality of active regions 102 are defined to intersect each other at a right angle to form a grid pattern.

A plurality of gate structures $G_N$ are formed linearly to extend over intersecting regions 103 of the active regions 101 and 102 (where the active regions 101 and 102 overlap each other) at an angle of 45 degrees with respect to both the active regions 101 and 102. N-type diffusion regions (306 in FIG. 3) are formed in the active regions 101 and 102 to interpose a gate structure $G_N$ (hereinafter also briefly referred to as a "gate") therebetween. In other words, the N-type diffusion regions are formed in the P-type active regions 101 and 102 except areas covered with the gate structures $G_N$.

The diffusion regions are each provided with either of contacts $D_M$ and $D_I$ to be connected to metal interconnects $M_1$ and $M_2$, respectively, formed on an overlying interlayer insulating film (not shown). A plurality of metal interconnects $M_1$ are arranged in the vertical direction in the drawing to extend over the contacts $D_M$ formed on the active regions 101, while a plurality of metal interconnects $M_2$ are arranged in the horizontal direction in the drawing to extend over the contacts $D_I$ formed on the active regions 102.

In the drawing, an active region 101, an active region 102, a gate structure $G_N$ extending over an intersecting region 103 and four contacts constitute one memory cell $C_{IM}$ indicated as a rectangle by dotted lines. The four contacts $D_M$, $D_{M+1}$, $D_I$ and $D_{I+1}$, each correspond to either a drain terminal or a source terminal in accordance with an operation of the memory cell $C_{IM}$.

Here, the above configuration is not limited as described above. The gate structures $G_N$ need to extend over the intersecting regions 103, but are not required to form an angle of 45 degrees with respect to both the active regions 101 and 102. However, in the case of forming the gate structures $G_N$ to extend over the intersecting regions 103 at an angle smaller than 45 degrees, for example, with respect to the active regions 101, the active regions 102 need to be defined at a greater distance such that the gate structures $G_N$ extend over all of the intersecting regions 103.

Forming the gate structures $G_N$ to form an angle of 45 degrees with respect to the active regions 101 and 102 as described above allows the active regions 101 and 102 to be defined at an equal distance, which reduces the memory cell area.

Further, as will be described later, the gate structures $G_N$ each includes a gate insulating film and a gate electrode formed thereon. Here, gate insulating films of the gate structures $G_N$ alone may be formed separately on the intersecting regions 103, respectively, and gate electrodes may be formed to extend linearly.

However, the gate insulating films and gate electrodes can be formed at the same time when they have the same shape as described in the present embodiment, unlike in the configuration in which gate insulating films alone are formed separately. Therefore, a photolithography step and an etching step can be omitted.

FIG. 2 is a top view showing exemplary dimensions of one memory cell $C_{IM}$ of the memory cell array shown in FIG. 1. In this drawing, illustration of the metal interconnects $M_1$ and $M_2$ is omitted. In the case where the active regions 101 and 102 each have a width $W_1$ of 0.121 µm, the gate structure $G_N$ has a width $W_{GATE}$ of about 0.17 µm when formed to cover the intersecting region 103. Further, the gate structure $G_N$ forms an angle a of 45 degrees with respect to both the active regions 101 and 102. In such configuration, the memory cell has a width $W_2$ of about 0.44 µm.

FIG. 3 is a schematic sectional view taken along the line A—A shown in FIG. 2. The gate structure $G_N$ is formed on the silicon substrate. The gate structure $G_N$ includes a gate insulating film 304 of a so-called ONO (oxide-nitride-oxide) film made up of a silicon oxide film 301, a silicon nitride film formed on the silicon oxide film 301 and a silicon oxide film 303 formed on the silicon nitride film 302, and a gate electrode 305 of a polysilicon film formed on the gate insulating film 304. In other words, in the present embodiment, silicon oxide films are used as first and third insulating films, and a silicon nitride film is used as a second insulating film. It is well known that the nitride film has many traps therein and is characterized by discretely trapping electrons.

The diffusion regions 306 are formed with a gate structure $G_N$ interposed therebetween. Specifically, referring to FIG. 2, the diffusion regions 306 are formed in the active region 101 except the area covered with the gate structure $G_N$. Referring to FIG. 3, the contact $D_M$ is formed on the left one of the diffusion regions 306 and the contact $D_{M+1}$ is formed on the right one of the diffusion regions 306, although detailed illustration of the structures of the contacts are omitted.

A driving method of the semiconductor memory device according to the present invention will be described now. For instance, when driving the memory cell $C_{IM}$ shown in FIG. 1 in the memory cell array, an N-th gate structure $G_N$ is selected. The number N is given by the equation: N=I+M−1. In general, an R(=P+Q−1)-th gate structure $G_R$ shall be selected for driving a memory cell $C_{PQ}$. Then, the gate structure $G_N$ (N=I+M−1) can also be selected for driving other memory cells $C_{I-1M+1}$ and $C_{I+1M-1}$ having the same gate. The contacts $D_M$ and $D_{M+1}$ are selected as one pair of source and drain terminals, and the contacts $D_I$ and $D_{I+1}$ are selected as the other pair of source and drain terminals.

FIG. 4 is a top view of the memory cell $C_{IM}$ thus selected. In this drawing, illustration of the metal interconnects $M_1$ and $M_2$ is omitted, similarly to FIG. 2. Reference characters $T_1$ to $T_4$ each denote a position (or electron storing position) where electrons are to be stored in the silicon nitride film 302 of the gate $G_N$ by a programming operation in the memory cell which will be discussed later. FIGS. 5 to 8 are schematic sectional views taken along the line B—B shown in FIG. 4. In these drawings, detailed illustration of the structures of the contacts $D_M$ and $D_{M+1}$ is omitted, similarly to FIG. 3.

A programming operation will be discussed referring to FIG. 5. In the case of storing electrons in the electron storing position $T_1$ shown in FIGS. 4 and 5, a voltage of about 10V is applied to the gate electrode 305 of the gate $G_N$ as a programming gate voltage, and a voltage of about 4V is applied to the contact $D_M$ serving as a drain terminal. A voltage of 0V is applied as a reference voltage to the contact $D_{M+1}$ serving as a source terminal, that is, the contact $D_{M+1}$ is grounded.

In this case, electrons supplied from the one of the diffusion regions 306 (hereinafter also briefly referred to as a "source") in contact with the contact $D_{M+1}$ serving as a source terminal are given energy when passing through an inversion layer 501 formed under the gate $G_N$, and turn into so-called hot electrons in the vicinity of the other one of the diffusion regions 306 (hereinafter also briefly referred to as a "drain") in contact with the contact $D_M$ serving as a drain terminal. The positive voltage applied to the gate electrode 305 causes these hot electrons to pass through the silicon oxide film 301 and to be stored (or trapped) in the silicon nitride film 302 in the electron storing position $T_1$.

For storing electrons in the electron storing position $T_2$, contrary to the case shown in FIG. 5, a voltage of about 4V is applied to the contact $D_{M+1}$ serving as a drain terminal, and the contact $D_M$ is grounded as a source terminal. A voltage of about 10V is applied to the gate electrode 305 as a programming gate voltage.

The programming gate voltage is not necessarily be 10V, but needs to be defined as equal to or higher than a threshold voltage such that a drain current flows even with electrons stored in the electron storing position $T_1$. In general, when electrons are stored in an electron storing position, an electric field caused by a voltage applied to the gate is partly shielded by the stored electrons, which requires extra voltage to be applied in order to form an inversion layer.

Specifically, the threshold voltage is higher than in the state which no electron is stored in the electron storing position $T_1$. With the programming gate voltage defined as described above, the drain current flows even with electrons already stored in, for example, the electron storing position $T_1$, so that electrons can further be stored in the electron storing position $T_2$.

For storing electrons in the electron storing position $T_3$ or $T_4$, the same operation as described shall be performed taking the contacts $D_{I+1}$ and $D_I$ as a source terminal and a drain terminal, respectively. Repeated explanation is omitted here to avoid redundancy.

Next, an erase operation will be discussed referring to FIG. 6. For erasing electrons stored in the electron storing position $T_1$, an erase voltage of about 7V is applied to the contact $D_M$ serving as a drain terminal. Further, an erase gate voltage of about −3V is applied to the gate electrode 305, and the contact $D_{M+1}$ serving as a source terminal is left open. At this time, the p-n junction between the drain and active region 101 is biased in the reverse direction, producing pairs of electron and hole in the vicinity of the drain. Holes generated at this time are injected into the silicon nitride film 302 through the silicon oxide film 301 with the erase gate voltage applied to the gate electrode 305, to thereby neutralize charges of the electrons already stored in the electron storing position $T_1$.

Figure 6:
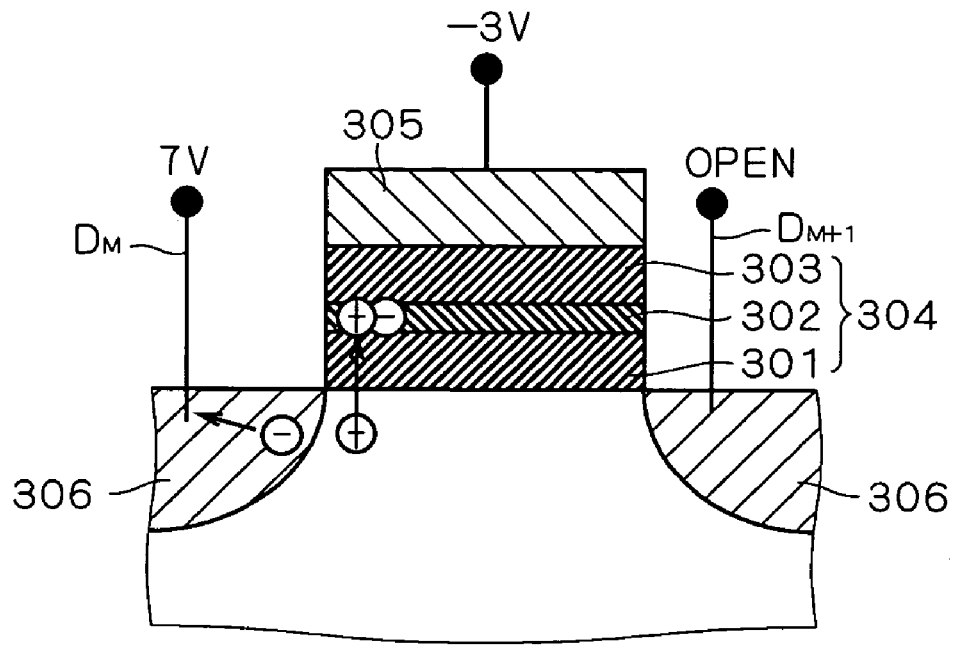
FIG. 6 is a sectional view showing an erase operation on the memory cell shown in FIG. 2.

Similarly, for neutralizing charges of electrons stored in the electron storing position $T_2$, contrary to the case shown in FIG. 6, an erase voltage of about 7V is applied to the contact $D_{M+1}$, the contact $D_M$ is left open, and an erase gate voltage of about −3V is applied to the gate electrode 305. Alternatively, charges of electrons stored in the electron storing positions $T_1$ and $T_2$ may be neutralized at the same time by applying an erase voltage to both the contacts $D_M$ and $D_{M+1}$ at the same time and an erase gate voltage to the gate electrode 305.

For neutralizing charges of electrons stored in the electron storing positions $T_3$ or $T_4$, the same operation as described shall be performed taking the contacts $D_{I+1}$ and $D_I$ as a source terminal and drain terminal, respectively. Repeated explanation is omitted here to avoid redundancy. In the above case, the source is not necessarily be left open, but a voltage of such a degree that no electron-hole pair is generated.

Next, a read operation will be discussed referring to FIGS. 7 and 8. For reading information as to whether or not electrons are present in the electron storing position $T_1$, a read voltage of about 1.5V is applied to the contact $D_{M+1}$ serving as a drain terminal. The contact $D_M$ serving as a source terminal is grounded, and a read gate voltage of about 3V is applied to the gate electrode 305. In other words, for storing electrons in the electron storing position $T_1$, the contacts $D_M$ and $D_{M+1}$ are set to play reverse roles to those in the programming operation. The read gate voltage is not limited to 3V, but needs to be defined as equal to or higher than a threshold voltage with no electron stored in the electron storing position $T_1$ such that no inversion layer is formed under the electron storing position $T_1$.

Figure 7:
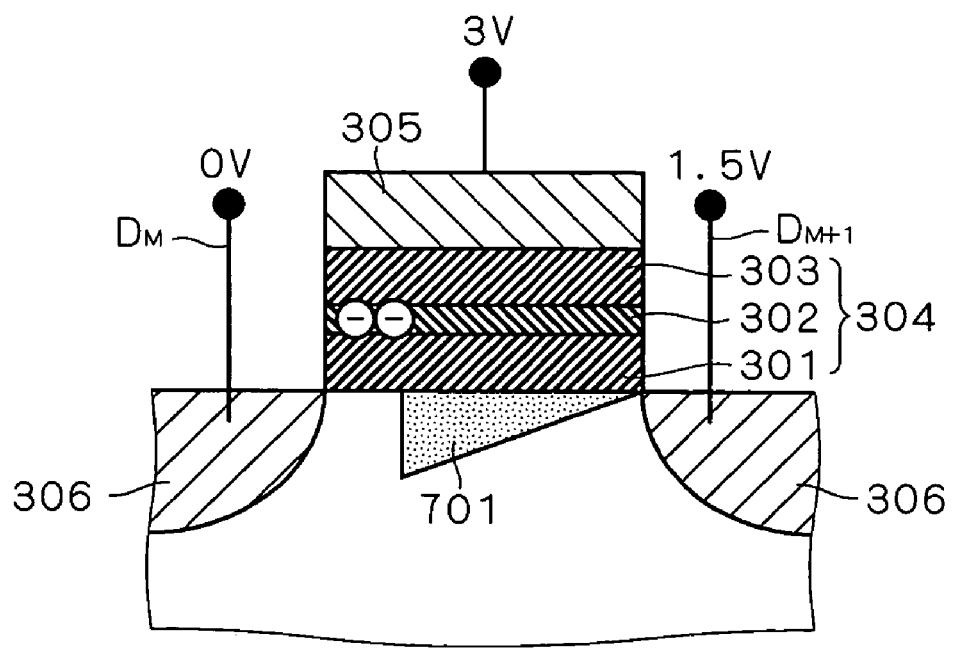
FIG. 7 is a sectional view showing a read operation on the memory cell shown in FIG. 2 at a written state.

With the read gate voltage defined as described above, at the written state in which electrons are stored in the electron storing position $T_1$, an inversion layer 701 under the gate is not formed to extend to the vicinity of the source due to the stored electrons, causing no drain current to flow (see FIG. 7). At the erased state in which no electron is stored in the electron storing position $T_1$, an inversion layer 801 is formed to extend from the drain to reach the source, causing a drain current to flow in the direction of the arrow (see FIG. 8).

In the case where electrons are already stored in the electron storing position $T_2$, no inversion layer will not be formed in a region under the electron storing position $T_2$. However, this region overlaps a region in which a depletion layer is to be formed by a voltage applied to the drain, and an electric field occurs in this depletion layer in the direction of transporting electrons to the drain. Accordingly, electrons having reached the vicinity of the drain are absorbed into the electric field in the depletion layer to flow into the drain electrode.

That is, the application of voltages to the respective terminals allows a judgment to be made between the written state in which electrons are stored in the electron storing position $T_1$ and the erased state in which no electron is stored in the electron storing position $T_1$, depending on whether or not a drain current flows.

Figure 8:
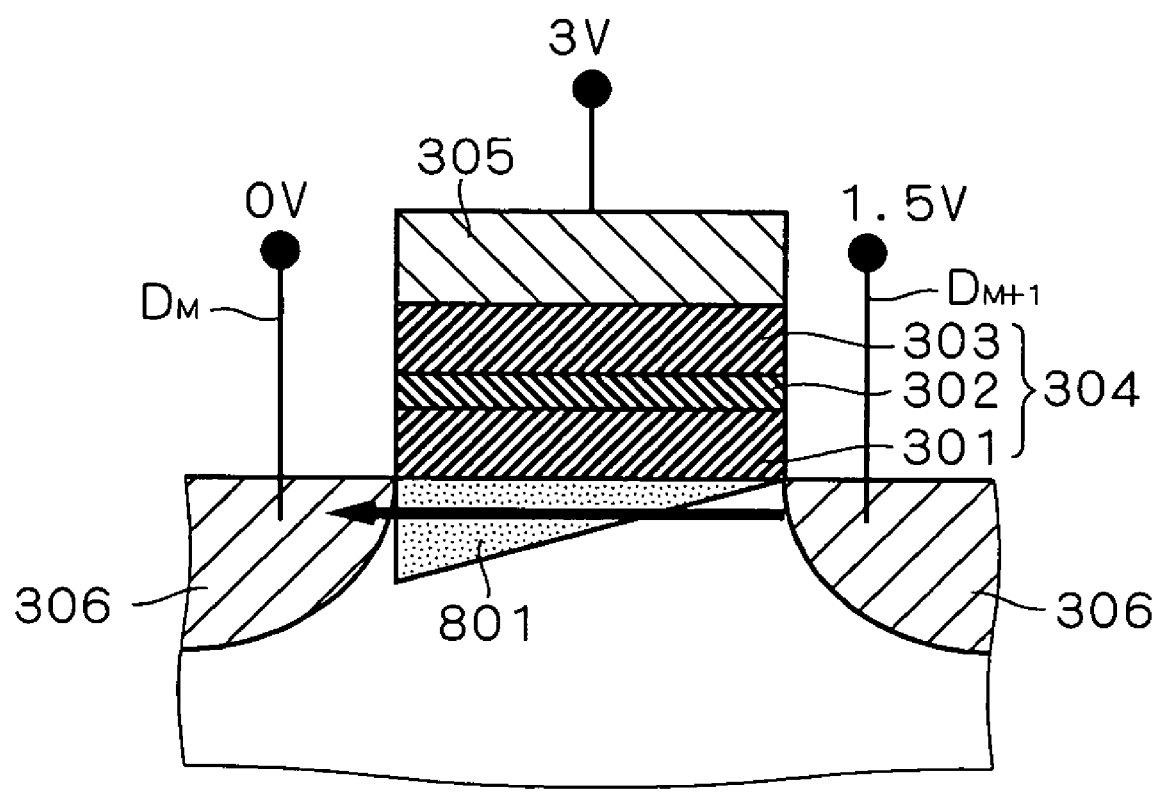
FIG. 8 is a sectional view showing a read operation on the memory cell shown in FIG. 2 at an erased state.

Similarly, a judgment is made as to whether or not electrons are stored in the electron storing position $T_2$ depending on whether or not a drain current flows in the case where, contrary to the case shown in FIGS. 7 and 8, the contact $D_{M+1}$ serving as a source terminal is grounded, a read voltage of about 1.5V is applied to the contact $D_M$ serving as a drain terminal and a read gate voltage is applied to the gate electrode 305. As to whether or not electrons are stored in the electron storing position $T_3$ or $T_4$, a judgment is made by the same operation as described above taking the contacts $D_I$ and $D_{I+1}$ as a source terminal and a drain terminal, respectively, and vice versa. Repeated explanation is omitted here to avoid redundancy.

The above description is directed to the case in which the contacts $D_{M+1}$ and $D_M$ are selected as one pair of source and drain terminals and the contacts $D_{I+1}$ and $D_I$ are selected as the other pair of source and drain terminals. However, the contacts $D_M$ and $D_I$ may be selected as one pair, and the contacts $D_{M+1}$ and $D_{I+1}$ may be selected as the other pair. Alternatively, the contacts $D_M$ and $D_{I+1}$ may be selected as one pair, and the contacts $D_{M+1}$ and $D_I$ may be selected as the other pair.

In the semiconductor memory device according to the present embodiment, the two active regions 101 and 102 are formed to intersect each other, and the gate structures $G_N$ are formed to extend over the intersecting regions 103. The diffusion regions 306 are formed in the active regions 101 and 102 except the area covered with the gate structure $G_N$. Therefore, with the help of hot electrons generated in the vicinity of the one of the diffusion regions 306, it is possible to store electrons locally in the gate insulating film 304 in the vicinity of the diffusion regions 306.

Specifically, the gate structure $G_N$ is in contact with the diffusion regions 306 at four points, and electrons can be locally stored in the gate insulating film 304 in the vicinity of the diffusion regions 306. This allows 4-bits of information to be stored in one memory cell. Further, the present embodiment does not require a complicated gate structure, allowing the semiconductor memory device to be manufactured without any increase in the number of manufacturing steps.

The configuration and materials of the gate insulating film 304 and gate electrode 305 in the gate structure $G_N$ are not limited to those described in the present embodiment. The gate insulating film 304 only needs to be capable of locally storing electrons and holding them therein. However, the use of the so-called ONO film of layered structure of silicon oxide film/silicon nitride film/silicon oxide film for the gate insulating film 304 as in the present embodiment allows a semiconductor memory device to be manufactured with high reliability and low costs, since the silicon oxide film and silicon nitride film constituting the ONO film are both widely known as materials for semiconductor memory devices, and their physical and chemical characteristics and the technique of depositing these films have been established using accumulated data.

Although the gate electrode 305 has been described as the polysilicon film in the present embodiment, it is not limited to a polysilicon film, but may be any conductive material. For instance, the use of a metal of lower resistance for the gate electrode 305 to reduce the resistance of the gate electrode 305 can reduce the wiring delay, which contributes to high speed operation.

Since the programming operation according to the present embodiment uses hot electrons generated in the vicinity of the diffusion regions 306, electrons can be locally stored in the vicinity of the diffusion regions 306 in the gate insulating film 304. Accordingly, electrons can be locally stored at the respective four points in the vicinity of the diffusion regions 306 in the gate insulating film 304. Further, the erase operation is conducted by generating hot holes in the vicinity of electrons to be erased and injecting the hot holes into the gate insulating film 304, so that stored electrons are erased independently.

Furthermore, in the read operation, whether or not an inversion layer is formed to reach the source so that current flows depends on the presence or absence of electrons locally present in the gate insulating film 304. Therefore, information as to whether or not electrons are present at each of the four points are read independently. Still further, there are three ways to divide the four contacts into two pairs, which increases flexibility in circuit configuration.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory device comprising:
    a first active region defined linearly on a surface of a substrate;
    a second active region defined linearly on said surface of said substrate to intersect said first active region in an intersecting region;
    first and second diffusion regions formed in said first active region to interpose said intersecting region therebetween;
    third and fourth diffusion regions formed in said second active region to interpose said intersecting region therebetween;
    a gate structure formed linearly on said substrate to extend over said intersecting region at a non-zero angle with respect to the first and second active regions; and
    first to fourth terminals connected to said first to fourth diffusion regions, respectively.

2. The semiconductor memory device according to claim 1, wherein
    said first and second active regions intersect each other at a right angle, and
    said gate structure intersects both of said first and second active regions at an angle of 45 degrees.

3. The semiconductor memory device according to claim 1, wherein
    said gate structure includes:
    a gate insulating film having a first insulating film, a second insulating film formed on said first insulating film capable of trapping electrons and a third insulating film formed on said second insulating film; and
    a gate electrode formed on said gate insulating film.

4. The semiconductor memory device according to claim 3, wherein
    said gate electrode is made of metal.

5. A driving method of a semiconductor memory device which comprises:
    a first active region defined linearly on a surface of a substrate;
    a second active region defined linearly on said surface of said substrate to intersect said first active region in an intersecting region;
    first and second diffusion regions formed in said first active region to interpose said intersecting region therebetween;
    third and fourth diffusion regions formed in said second active region to interpose said intersecting region therebetween;
    a gate structure formed linearly on said substrate to extend over said intersecting region at a non-zero angle with respect to the first and second active regions; and
    first to fourth terminals connected to said first to fourth diffusion regions, respectively, wherein
    said gate structure includes:
    a gate insulating film having a first insulating film, a second insulating film formed on said first insulating film capable of trapping electrons and a third insulating film formed on said second insulating film; and
    a gate electrode formed on said gate insulating film,
    said driving method comprising the steps of:
    (a) dividing said four terminals into predetermined first and second pairs, applying a programming voltage to one terminal of said first pair, applying a reference voltage to the other terminal of said first pair, and applying a programming gate voltage to said gate electrode, thereby storing electrons in said second insulating film;
    (b) applying an erase voltage to said one terminal or both terminals of said first pair and applying an erase gate voltage to said gate electrode, thereby erasing electrons stored in said second insulating film; and
    (c) applying said reference voltage to said one terminal of said first pair, applying a read voltage to said other terminal of said first pair, and applying a read gate voltage to said gate electrode, thereby judging whether or not electrons are stored in said second insulating film depending on whether or not a drain current flows.

6. The driving method according to claim 5, wherein
    said steps (a) to (c) performed on said first pair are also performed on said second pair.

* * * * *

UNITED STATES PATENT AND TRADEMARK OFFICE
CERTIFICATE OF CORRECTION

| | | |
|---|---|---|
| PATENT NO. | : 7,136,301 B2 | Page 1 of 1 |
| APPLICATION NO. | : 10/956124 | |
| DATED | : November 14, 2006 | |
| INVENTOR(S) | : Shigeo Tokumitsu | |

It is certified that error appears in the above-identified patent and that said Letters Patent is hereby corrected as shown below:

On the title page Item (57)

Under section "Abstract", change "Further, terminals to be connected to metal interconnects are provided on the diffusion region at a non-zero angle with respect to the first and second active regions, respectively. " to -- Further, terminals to be connected to metal interconnects are provided on the diffusion regions, respectively. --

Signed and Sealed this

Twenty-fourth Day of April, 2007

JON W. DUDAS
*Director of the United States Patent and Trademark Office*